(12) United States Patent
Iwasawa et al.

(10) Patent No.: US 6,313,474 B1
(45) Date of Patent: Nov. 6, 2001

(54) METHOD FOR MEASURING DISTRIBUTION OF BEAMS OF CHARGED PARTICLES AND METHODS RELATING THERETO

(75) Inventors: Koji Iwasawa; Nobuo Nagai, both of Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 09/357,938

(22) Filed: Jul. 21, 1999

(30) Foreign Application Priority Data

Jul. 22, 1998 (JP) .................................................. 10-223587

(51) Int. Cl.⁷ ............................... H01J 37/08; G21K 5/10
(52) U.S. Cl. .................. 250/492.21; 250/397; 324/71.3; 324/71.4
(58) Field of Search ................... 250/397, 492.1–492.23; 324/71.3–71.4

(56) References Cited

FOREIGN PATENT DOCUMENTS

| 0 398 270 | 11/1990 | (EP) . |
| 0 508 9811 | 4/1993 | (JP) . |

OTHER PUBLICATIONS

Nagai N. et al.: "The Nissin NH–20SP Medium–Current Ion Implanter" Nuclear Instruments & Methods In Physics Research, Section—B: Beam Interactions With Materials and Atoms, NL, North—Holland Publishing Company. Amsterdam, vol. B55, No. 1 / 04, Apr. 2, 1991 (1991–04–02), pp. 393–397, col. 1, line 15.

European Search Report for EP Application No. 99114152 dated Feb. 2, 2001.

Primary Examiner—Teresa M. Arroyo
Assistant Examiner—Sharon Payne
(74) Attorney, Agent, or Firm—Finnegan, Henderson, Farabow, Garrett & Dunner, L.L.P.

(57) ABSTRACT

Current density distributions of the ion beam in the scanning direction (the direction of X) at two points $Z_f$ and $Z_b$ on Z-coordinate are respectively measured by Faraday arrays. Using the thus measured current density distributions, a current density distribution in the scanning direction of the ion beam at an arbitrary position on Z-coordinate located in a workpiece is found by the method of interpolation. Using the thus found current density distribution, a waveform of scanning voltage $V(t)$ of the ion beam is reformed so that a scanning speed of the ion beam can be relatively decreased at a position where the current density must be raised in the current density distribution and a scanning speed of the ion beam can be relatively increased at a position where the current density must be lowered. Due to the foregoing, a current density distribution in the scanning direction of the ion beam at an arbitrary position on Z-coordinate located in the workpiece is adjusted to a desired distribution.

4 Claims, 9 Drawing Sheets

POSITION ON Z-COORDINATE

METHOD FOR MEASURING DISTRIBUTION OF BEAMS OF CHARGED PARTICLES AND METHODS RELATING THERETO

BACKGROUND OF THE INVENTION

1. Field of the Invention

The present invention relates to a method of measuring a current density distribution of a beam of charged particles at an arbitary position on Z-coordinate in a workpiece, a method of adjusting the current density distribution, and a method of irradiating the workpiece while the beam of charged particles conducts scanning by a preferable scanning electric waveform in a hybrid scanning type apparatus such as an ion-implantation apparatus, an ion beam irradiation apparatus and an electron beam irradiation apparatus in which electromagnetic scanning of a beam of charged particles such as a ion beams, and mechanical drive of a workpiece such as a semiconductor board are jointly used.

2. Description of the Related Art

As a typical example of the above apparatus in which a beam of charged particles is used, there is provided an ion-implantation apparatus in which a workpiece is irradiated with an ion beams so that the ions can be implanted. In the following explanations, the ion-implantation apparatus is taken up as an example.

Figure 7:
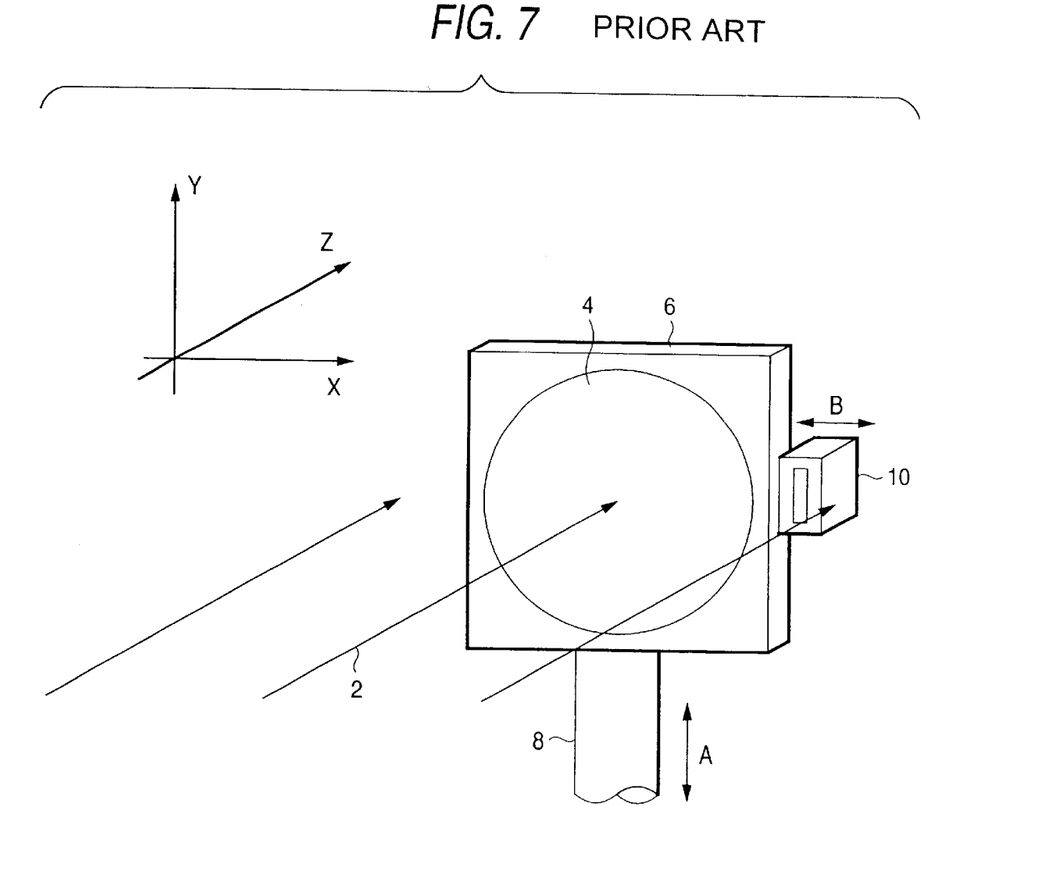
FIG. 7 is a perspective view showing an example of a workpiece and others of the conventional hybrid scanning type ion-implantation apparatus.

FIG. 7 is a schematic drawing showing a main portion of a conventional example of the hybrid scanning type ion-implantation apparatus. This apparatus is composed as follows. A workpiece (for example, a semiconductor board) 4 held by a holder 6 is mechanically reciprocated as shown by arrow A along one axis, which is Y-axis in this case, in the three dimensional space. Simultaneously, an ion beam 2, which proceeds along Z-axis substantially perpendicular to Y-axis, is electromagnetically subjected to scanning by a scanner not shown in the direction x substantially perpendicular to Y-axis and Z-axis, that is a ion beam 2 is subjected to scanning by an electric field and/or magnetic field, so that the workpiece 4 can be irradiated with the ion beam 2. Accordingly, it is possible to implant a desired dopant (impurities to be implanted) in a desired region (typically, all over the surface) of the workpiece 4 by a desired distribution (typically, uniformly). Reference numeral 8 designates a drive shaft for driving the holder 6.

In order to make the dopant exist in the desired region of the workpiece 4 by the desired distribution, it is necessary to control the mechanical drive of the workpiece 4 and the electromagnetic scanning of the ion beam 2 so that the desired distribution can be obtained. That is, in order to obtain the desired distribution in the direction of Y-axis, it is necessary to appropriately control the drive of the workpiece 4. Further, in order to obtain the desired distribution in the direction of X-axis, it is necessary to appropriately control the scanning of the ion beam 2. The present invention relates to the latter, that is, the present invention relates to the scanning of the ion beams.

In order to obtain the desired distribution of the dopant in the scanning direction of the ion beam 2 (the direction of X-axis), as well known, it is necessary to make a distribution of current density in the scanning direction of the ion beam 2 at a position where the ion beam 2 is incident upon the workpiece 4 coincide with the desired distribution of the dopant.

Therefore, conventionally, Faraday (current detector) 10, which is mechanically driven in the scanning direction of the ion beam 2, is arranged at a position of the workpiece 4 or in the proximity of the workpiece 4, and while Faraday 10 is driven as described above as shown by arrow B, a beam current is measured. Thus, a distribution of beam current density can be measured at the position. A scanner of the ion beam 2 is controlled by the measured data so that the distribution of beam current density at the position can be formed into a desired shape. This technique is disclosed, for example, in Toku Hyo Sho No. 64-500310.

Figure 8:
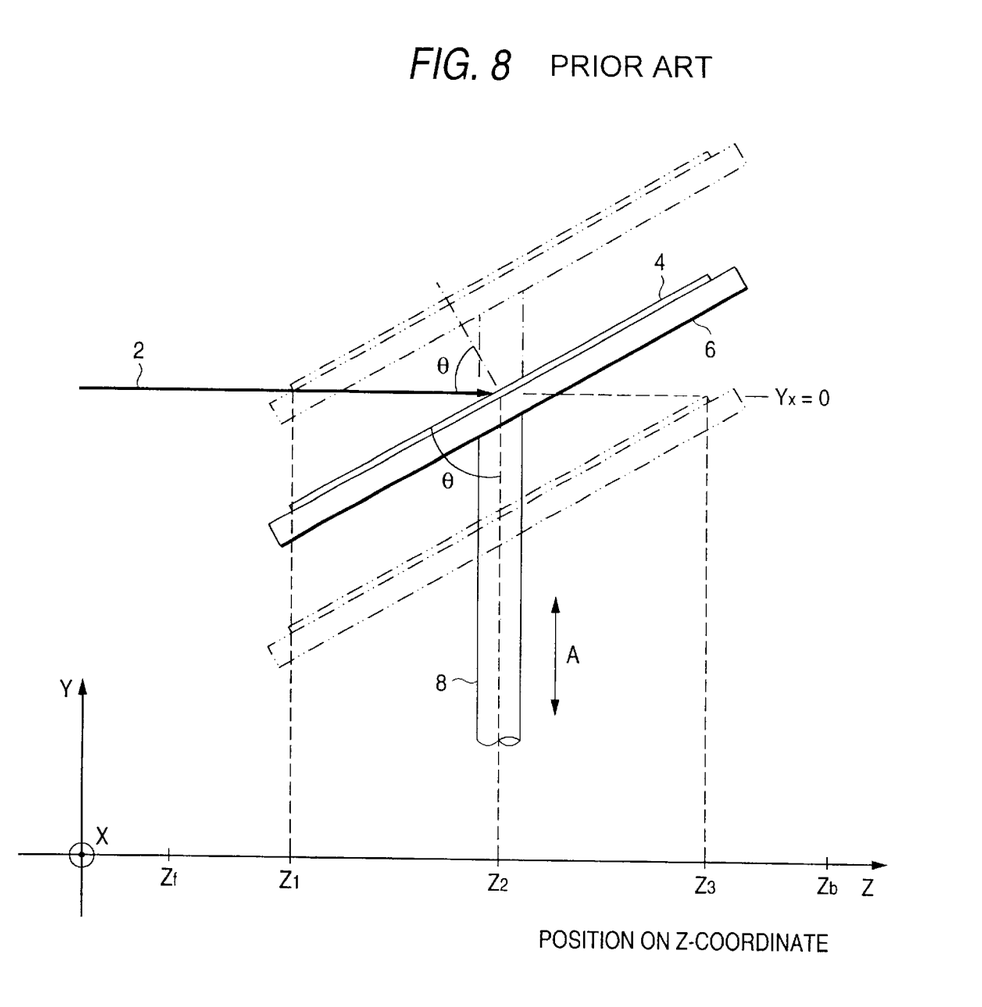
FIG. 8 is a side view showing a workpiece and others when the tilt angle θ is set at 60°.
Figure 9:
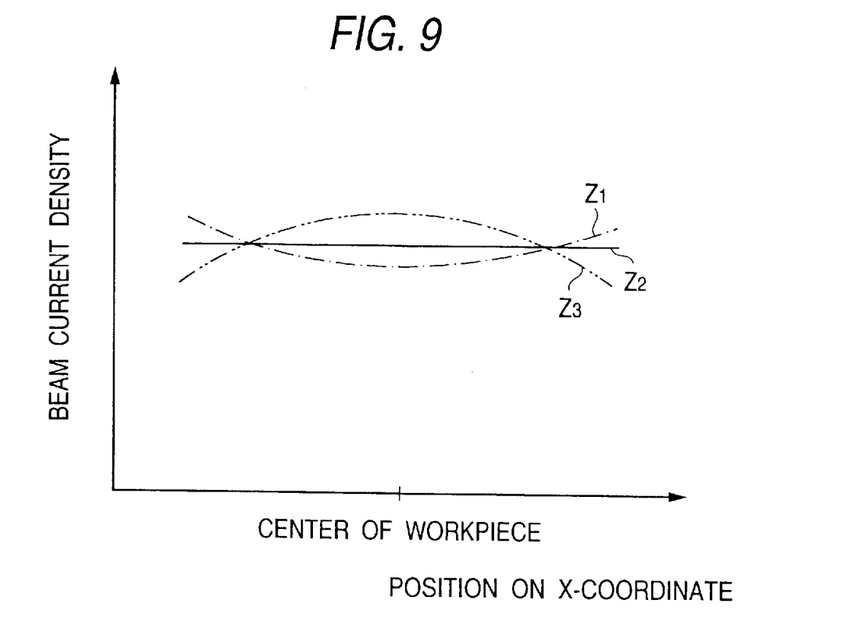
FIG. 9 is a view showing a simplified example of the beam current density distribution at positions $Z_1$, $Z_2$ and $Z_3$ on Z-coordinate in a conventional ion-implantation apparatus.

In the above ion-implantation apparatus, in any case, as illustrated in FIG. 8, when the workpiece 4 is mechanically driven, the holder 6 is inclined, so that a tilt angle θ, which is an angle formed between a surface of the workpiece 4 and Y-axis (in this case, the holder drive shaft 8), can be a constant value more than 0°. This tilt angle θ is the same as the incident angle of the ion beam 2 which is incident upon the surface of the workpiece 4. The reason why the tilt angle θ is set at a value more than 0° is to prevent the channeling effect of the ion beams with respect to a semiconductor board. Another reason why the tilt angle θ is set at a value more than 0° is that ions are also implanted onto side walls of the trench structure formed on the surface of the workpiece.

When the tilt angle θ is increased as shown in FIG. 8, position $Z_1$, on Z-coordinate at which the ion beam 2 subjected to scanning in X-direction is incident upon a lower end portion of the workpiece 4 in Y-direction and position $Z_3$ on Z-coordinate at which the ion beam 2 subjected to scanning in X-direction is incident upon an upper end portion of the workpiece 4 in Y-direction are greatly different from position $Z_2$ on Z-coordinate at the center of the workpiece 4. This tendency becomes more remarkable when a plane size of the workpiece 4 is increased.

In general, the ion beam 2, which has been electromagnetically subjected to scanning, is a group of ions, the proceeding directions of which are different a little from each other. Therefore, a distribution of beam current density in the scanning direction generally depends upon a position on Z-coordinate.

However, according to the conventional art described before, the distribution of current density of the ion beam 2 can be measured only at one point on Z-coordinate axis on which Faraday 10 is arranged, for example, the distribution of current density of the ion beam 2 can be measured only at position $Z_2$ on Z-coordinate. Accordingly, distributions of current density at an upper and a lower portion of the workpiece 4 are different from the distribution measured by Faraday 10. As a result, the distributions of the dopant at the upper and the lower portion of the workpiece are different from a desired distribution.

Figure 10:
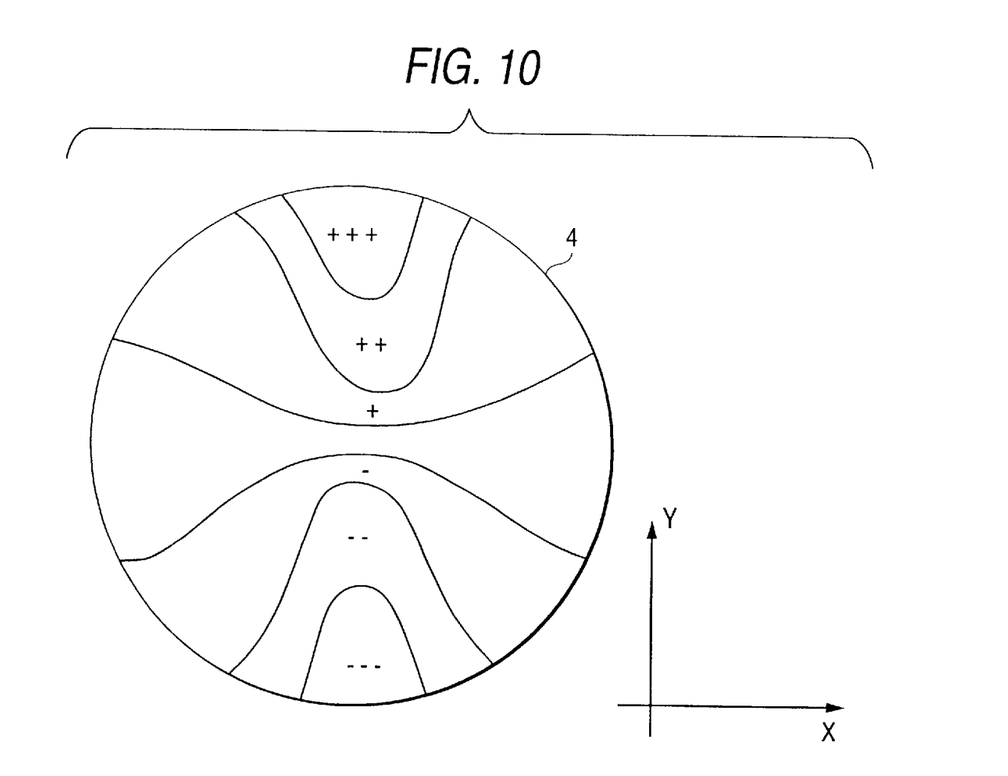
FIG. 10 is a view showing an example of the distribution of a quantity of implanted dopant on a face of a workpiece.

For example, in order to conduct ion-implantation uniformly all over the surface of the workpiece 4, when a beam scanner is controlled so that a distribution of beam current density in X-direction (scanning direction) can be uniform at position $Z_2$ on Z-coordinate, a shape of the distribution of beam current density at position $Z_1$, on Z-coordinate usually protrudes downward, and a shape of the distribution of beam current density at position $Z_3$ on Z-coordinate usually protrudes upward. As a result, as shown in FIG. 10, the distribution becomes non-uniform in such a manner that a quantity of implanted dopant on the surface of the workpiece 4 at the center in the direction of X-axis is increased in the proximity of the upper portion of the workpiece 4, and a quantity of implanted dopant on the surface of the workpiece 4 at the center in the direction of X-axis is decreased in the proximity of the lower portion of the workpiece 4. In FIG. 10, the quantity of implanted dopant is increased in the order of marks of ---, --, -, +, ++, +++.

SUMMARY OF THE INVENTION

It is an object of the present invention to provide a method of measuring a current density distribution of a beam of charged particles at an arbitrary position on Z-coordinate located in the workpiece in an apparatus in which a tilt angle of the workpiece can be set at a value more than 0°.

It is another object of the present invention to provide a method of adjusting the distribution to a desired one.

It is still another object of the present invention to provide a method of irradiating the workpiece with charged particles while charged particles are subjected to scanning by a desirable scanning electric waveform.

According to the first aspect of the present invention, a method of measuring distribution of a beam of charged particles comprises the steps of: measuring a first current density distribution in the scanning direction of the beam of charged particles at a first position on Z-coordinate and also measuring a second current density distribution in the scanning direction of the beam of charged particles at a second position on Z-coordinate; and finding a current density distribution in the scanning direction of the beam of charged particles at an arbitrary position on Z-coordinate by the interpolation or extrapolation by using the first and the second current density distribution.

According to this distribution measuring method, it is possible to freely find a distribution of beam current density at an arbitrary position on Z-coordinate located in the workpiece by the measurement of distribution of current density of the first and the second beam. Accordingly, even when the tilt angle and the plane size of the workpiece are large, a state of the distribution of beam current density can be accurately grasped on a surface of the workpiece including a portion in the proximity of an end portion in Y-direction of the workpiece.

According to the second aspect of the present invention, a method of adjusting distribution of a beam of charged particles comprises the step of: adjusting a current density distribution in the scanning direction of a beam of charged particles at an arbitrary position on Z-coordinate in the workpiece by reforming a scanning electric waveform of the beam of charged particles so that a scanning speed of the beam of charged particles can be relatively lowered at a position where the current density is to be increased in the current density distribution and also a scanning speed of the beam of charged particles can be relatively raised at a position where the current density is to be decreased, by using the current density distribution of the beam of charged particles at an arbitrary position on Z-coordinate in the workpiece which has been found by the method of measuring distribution of the beam of charged particles according to the first aspect.

According to the above method of adjusting distribution, it is possible to freely adjust a distribution of beam current density at an arbitrary position on Z-coordinate located in the workpiece. Accordingly, even if the tilt angle and the plane size of the workpiece are large, it is possible to irradiate a beam of charged particles at a desired distribution in a desired region of the workpiece.

According to the third aspect of the present invention, a first method of irradiating a beam of charged particles comprises the steps of: finding previously a plurality of scanning electric waveforms of a beam of charged particles for realizing a desired current density distribution at a plurality of positions on Z-coordinate in the workpiece according to the method of adjusting distribution according to the second aspect; calculating a position on Z-coordinate at which the beam of charged particles is incident upon the workpiece in real time by using the tilt angle of the workpiece in the irradiation of the beam of charged particles and also using a momentary position on Y-coordinate; selecting successively in real time a scanning electric waveform in which the position on Z-coordinate coincides with or is closest to the position on Z-coordinate calculated before, from the plurality of scanning electric waveforms found previously; and conducting irradiation on the workpiece while the beam of charged particles conducts scanning by the selected scanning electric waveform.

According to the first method of irradiating a beam of charged particles, it is possible to irradiate a beam of charged particles to a workpiece in accordance with a position at which the charged particles are incident upon the workpiece while scanning is being conducted by a scanning electric waveform appropriate for realizing a desired distribution of beam current density. Accordingly, even if the tilt angle and the plane size of the workpiece are large, it possible to irradiate a beam of charged particles by a desired distribution in a desired region of the workpiece. Further, this can be conducted by using a finite number of scanning electric waveforms. Therefore, the control and calculation becomes easy. Accordingly, this method can be effectively put into practical use.

According to the fourth aspect of the present invention, a second method of irradiating a beam of charged particles comprises the steps of: finding previously a plurality of scanning electric waveforms of a beam of charged particles for realizing a desired current density distribution at a plurality of positions on Z-coordinate in the workpiece according to the method of adjusting distribution according to the second aspect; calculating in real time a position on Z-coordinate at which the beam of charged particles is incident upon the workpiece by using the tilt angle of the workpiece in the irradiation of the beam of charged particles and also using a momentary position on Y-coordinate; weighting a difference among the plurality of scanning electric waveforms, which have been previously found, by the position on Z-coordinate which has been calculated before; calculating in real time successively a scanning electric waveform with respect to each position on Z-coordinate which has been calculated before; and conducting irradiation on the workpiece while the beam of charged particles conducts scanning by the calculated scanning electric waveform.

According to the second method of irradiating a beam of charged particles, it is possible to provide the same effect as that of the first method of irradiating a beam of charged particles while a smaller number of scanning electric waveforms are being used.

PREFERRED EMBODIMENTS OF THE INVENTION

Preferred embodiments of the present invention will be described as follows referring to the accompanying drawings.

Figure 1:
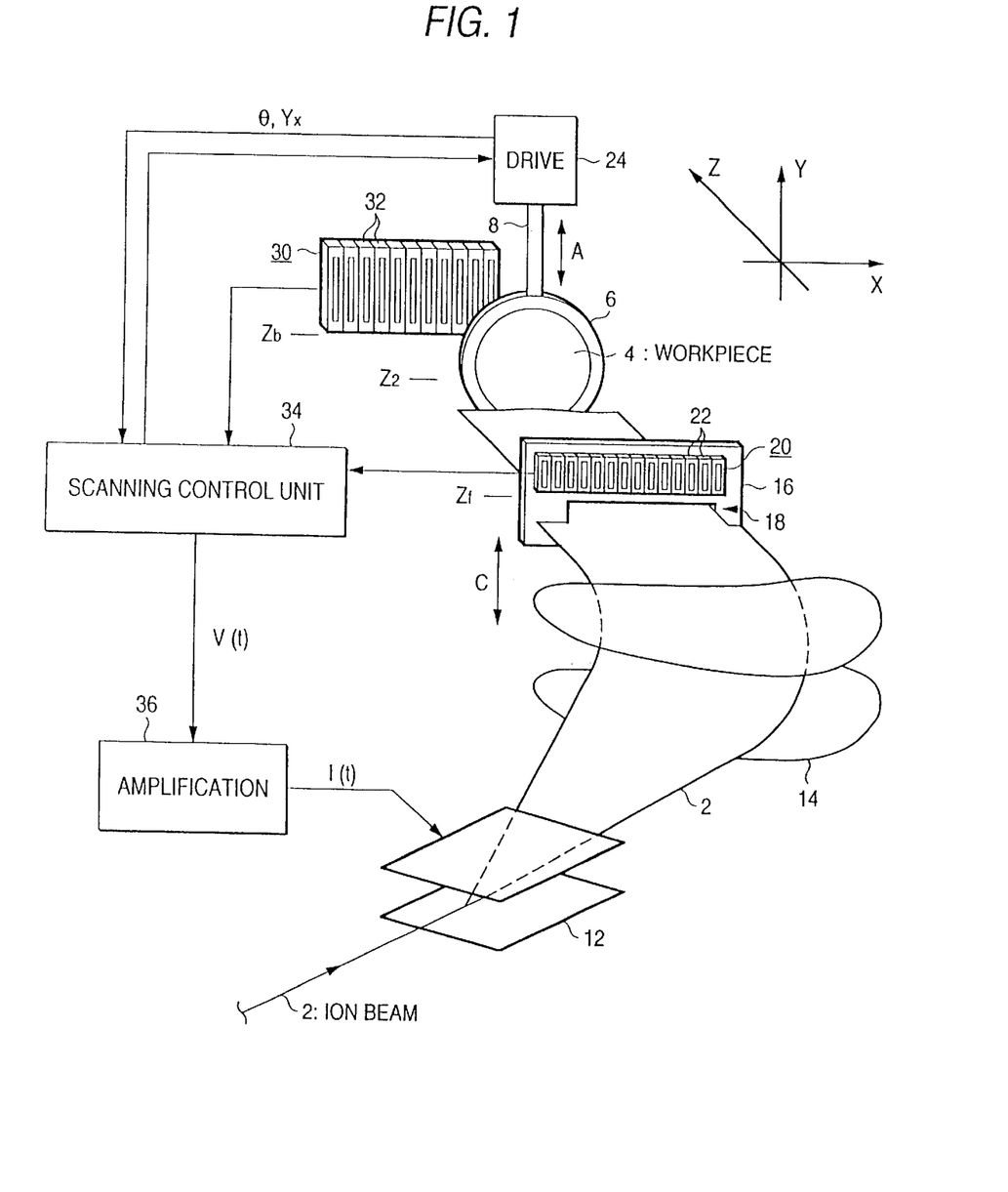
FIG. 1 is a perspective view showing an embodiment of the hybrid scanning type ion-implantation apparatus for carrying out the distribution measuring method of the present invention.

FIG. 1 is a perspective view showing an embodiment of a hybrid scanning type ion-implantation apparatus in which the distribution measuring method and others of the present invention are carried out. The same reference characters and numbers in FIG. 7 are applied to the same or similar parts throughout FIG. 1 showing this embodiment. Different points of this embodiment from the conventional example are mainly explained as follows.

The apparatus of this embodiment is composed as follows. An ion beam 2 generated by an ion source not shown is accelerated and subjected to mass separation when necessary. Then, the ion beam 2 is electromagnetically scanned by a scanner 12. Further, in this embodiment, the ion beam 2 is parallelized by a parallelizer 14. After that, a workpiece 4 set on the holder 6 is irradiated with the ion beam 2. In this embodiment, the drive directions of the workpiece 4 and the holder 6, the proceeding direction of the ion beam 2 irradiating on the workpiece 4 and the scanning direction are the same as those of the conventional example shown in FIG. 7. These directions are respectively directions of Y-axis, Z-axis and X-axis.

For the convenience of explanations, the holder shaft 8 and the holder drive unit 24 for driving the holder shaft 8 are arranged on the upper side of the holder 6 in the drawing. However, they can be arranged on the lower side of the holder 6. As disclosed in Japanese Examined Patent Publication No. 7-54688, the holder 6 and the workpiece 4 may be mechanically reciprocated along Y-axis by an oscillating type pivotal arm.

In this embodiment, the scanner 12 is composed of a pair of scanning magnetic poles. A triangular-wave-like scanning voltage V(t), which is outputted from the scanning control unit 34, is amplified by the amplifier 36 and converted into an electric current waveform I(t) by the amplifier 36 and then supplied to the scanner 12.

The parallelizer 14 is not essential to the present invention. Therefore, the parallelizer 14 may be arbitrarily provided in the apparatus.

There are provided a first Faraday array 20 ("front Faraday") and a second Faraday array 30 ("back Faraday") in the direction of Z-axis in the proximity of the holder 6. Positions of both Faraday arrays 20, 30 on Z-coordinate are respectively represented by $Z_f$ and $Z_b$. In this embodiment, referring to FIG. 8, a relation of $Z_f < Z_1 < Z_2 < Z_3 < Z_b$ can be satisfied. $Z_1$, $Z_2$ and $Z_3$ have already been explained above. The Faraday arrays 20, 30 are composed in such a manner that a plurality of Faraday cups 22, 32, the specifications of which are the same, respectively having slits which are long and slender in the direction of Y-axis, are arranged in the direction of X which is a scanning direction of the ion beam 2. Positions of the Faraday cups 22, 32 on X-coordinate are previously known.

Each Faraday cup 22, 32 receives an ion beam 2 and measures a beam current. An area of each Faraday cup 22, 32 upon which the beam is incident is previously known. Therefore, it is possible to measure beam current density of the ion beam 2 which are incident upon each Faraday cup 22, 32. Accordingly, it is possible to measure beam current density distribution of the ion beam 2 in the direction of X at positions $Z_f$ and $Z_b$ on Z-coordinate by the Faraday arrays 20, 30. Data measured by both Faraday arrays 20, 30 is supplied to the scanning control device 34 in this embodiment.

In this embodiment, the Faraday array 20 on the upstream side is arranged in the front portion of a mask plate 16 having an opening 18. These are driven in the vertical direction as shown by arrow C by a drive unit not shown in the drawing. In FIG. 1, the mask plate 16 and Faraday array 20 are located at an upper limit position. In the above condition, a portion of the ion beam 2, which has completed scanning, passes through the opening 18 of the mask plate 16. After the ion beam 2 has passed through the opening 18, when implantation is conducted on the workpiece 4 on the holder 6, the ion beam 2 is irradiated to the workpiece 4 as shown in the drawing. However, when implantation is not conducted on the workpiece 4 on the holder 6, the holder 6 is retracted to a position at which the ion beam 2 is not obstructed by the holder 6. Therefore, the ion beam 2 is incident upon the Faraday array 30 arranged on the downstream side. Accordingly, it is possible to measure a beam current density distribution of the ion beam 2 in the direction of X by the Faraday array 30 on the downstream side in this case.

When the mask plate 16 and the Faraday array 20 are arranged at the lower limit position, the Faraday array 20 obstructs the ion beam 2 which has been scanned. Therefore, it is possible to measure a distribution of beam current density of the ion beam 2 in the direction of X.

(1) In the apparatus shown in FIG. 1, a method of measuring a distribution of current density of the ion beam 2, which has been subjected to scanning, will be explained below.

First, beam current density distribution S (X, $Z_f$) in the scanning direction (X-direction) of the ion beam 2 at position $Z_f$ on Z-coordinate is measured by the Faraday array 20 arranged on the upstream side. An example of the result of the measurement, which is simplified, is shown in FIG. 3.

Next, beam current density distribution S (X, $Z_b$) in the scanning direction (X-direction) of the ion beam 2 at position $Z_b$ on Z-coordinate is measured by the Faraday array 30 arranged on the downstream side. An example of the result of the measurement, which is simplified, is shown in FIG. 3.

Figure 3:
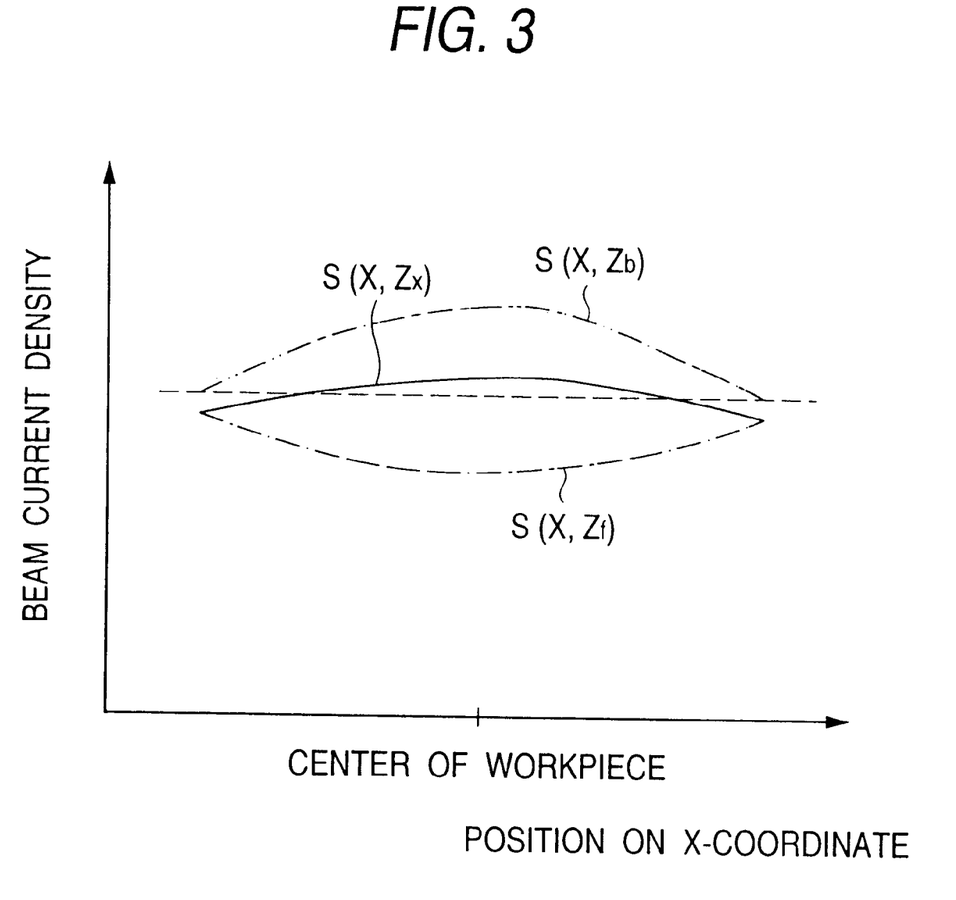
FIG. 3 is a view showing a simplified example of the beam current density distribution at positions $Z_f$, $Z_b$ and $Z_x$ on Z-coordinate.

According to the above data, it can be concluded that the beam current density distribution is changed from S (X, $Z_f$)

in FIG. 3 to S (X, $Z_b$) while the ion beam 2 proceeds from the Faraday array 20 arranged on the upstream side to the Faraday array 30 arranged on the downstream side.

In this connection, from the practical viewpoints, there is no external electromagnetic field, which changes a path of the ion beam 2, between the Faraday arrays 20 and 30. Since it is designed that no focus of the ion beam 2 exists in this section, divergence effect (space charge effect) caused by the self-electric field of the ion beam 2 is negligibly small. Accordingly, it is possible to assume that the traveling direction of the ion beam 2 is not changed in this section. Further, generation and extinction of the ion beam 2 in this section are negligibly small. The above can be said in this type ion-implantation apparatus.

Accordingly, as shown by the following expression 1, beam current density distribution S (X, $Z_x$) in the direction of X of the ion beam 2 at an arbitrary position $Z_x$ ($Z_1 \leq Z_x \leq Z_3$) on Z-coordinate in the workpiece 4, which exists between both Faraday arrays 20 and 30, can be expressed by beam current density S (X, $Z_f$) at the multiple Faraday 20 and beam current density S (X, $Z_b$) at multiple Faraday 30.

$$S(X, Z_x)=S(X, Z_f)+\{S(X, Z_b)-S(X, Z_f)\}\times (Z_x-Z_f)/(Z_b-Z_f)$$ [Expression 1]

Accordingly, it is possible to find beam current density distribution S(X, $Z_x$) at position $Z_x$ on Z-coordinate according to Expression 1. This method is referred to as an interpolation. An example of beam current density distribution S(X, $Z_x$), which has been found in this way, is shown in FIG. 3, wherein this beam current density distribution is simplified for convenience of explanation.

In this connection, also when both Faraday arrays 20 and 30 are arranged in the proximity of the workpiece 4 on the upstream side or the downstream side, the same relation as that of Expression 1 is established. Therefore, it is possible to find beam current density distribution S(X, $Z_x$) at position $Z_x$ on Z-coordinate according to the above expression. This method is referred to as an extrapolation.

In this embodiment, the above measurement of the beam current density distribution can be made by using the two Faraday arrays 20, 30 and the scanning control unit 34.

According to the above measurement method, when the beam current density distribution is measured only at two positions ($Z_f$, $Z_b$), it is possible to freely find a beam current density distribution at an arbitrary position $Z_x$ on Z-coordinate located in the workpiece 4. Accordingly, even when the tilt angle θ and the plane size of the workpiece 4 are large, a state of the distribution of beam current density can be accurately grasped on a surface of the workpiece 4 including a portion in the proximity of an end portion in Y-direction of the workpiece 4.

(2) Next, explanation will be made to a method of adjustment by which beam current density distribution S(X, $Z_x$) that has been found in the above manner can become a desired distribution.

First, as an example, deviation dev(X, $Z_x$), which is defined by the following expression, of beam current density distribution S(X, $Z_x$) is found. In this case, mean S($Z_z$) is an average of S(X, $Z_x$).

$$dev(X, Z_x)=\{S(X, Z_x)-mean\ S(Z_x)\}/mean\ S(Z_x)$$ [Expression 2]

A simplified example of deviation dev(X, $Z_x$), which has been found in the manner described above, is shown in FIG. 4A. A positive portion of deviation dev(X, $Z_x$) is a portion in which the current density is higher than the average, and a negative portion of deviation dev(X, $Z_x$) is a portion in which the current density is lower than the average.

In this case, a waveform of scanning voltage V(t) of the ion beam 2 is formed so that a scanning speed of the ion beam 2 can be relatively reduced at a position where the beam current density must be increased. Specifically, the adjustment is made as follows. Inclination ΔV(t)/Δt of scanning voltage V(t) in a portion corresponding to a position where the beam current density must be increased is reduced; inclination ΔV(t)/Δt of scanning voltage V(t) in a portion corresponding to a position where the beam current density must be decreased is extended; or both are jointly used. Due to the foregoing, deviation dev(X, $Z_x$) at position $Z_x$ can be adjusted to a desired value, that is, beam current density distribution S(X, $Z_x$) at position $Z_x$ can be adjusted to a desired distribution.

Figure 4A:
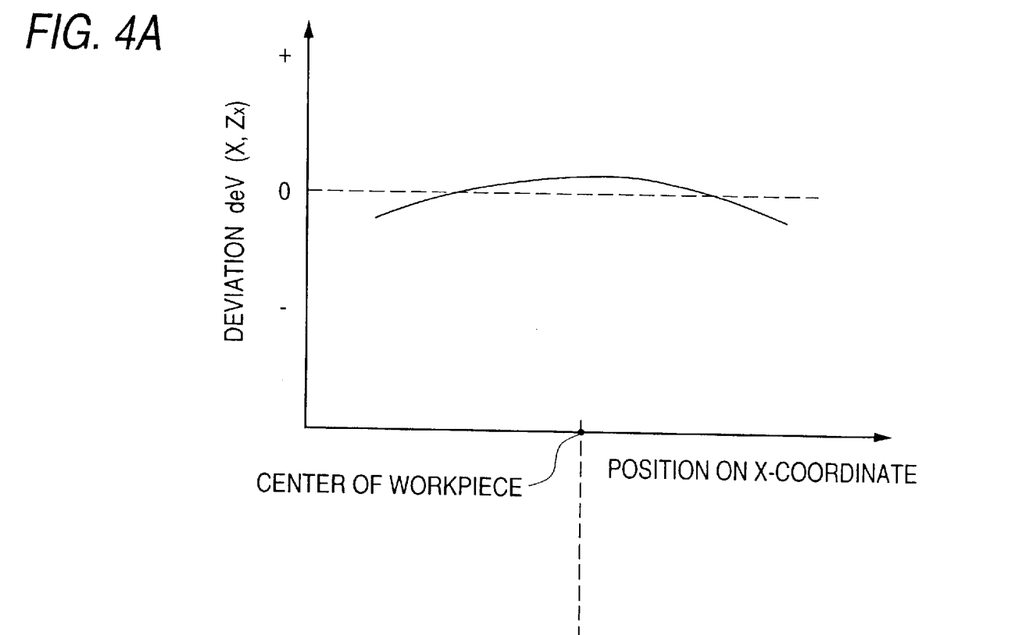
FIG. 4A is a view showing a simplified example of deviation of the beam current density distribution.
Figure 4B:
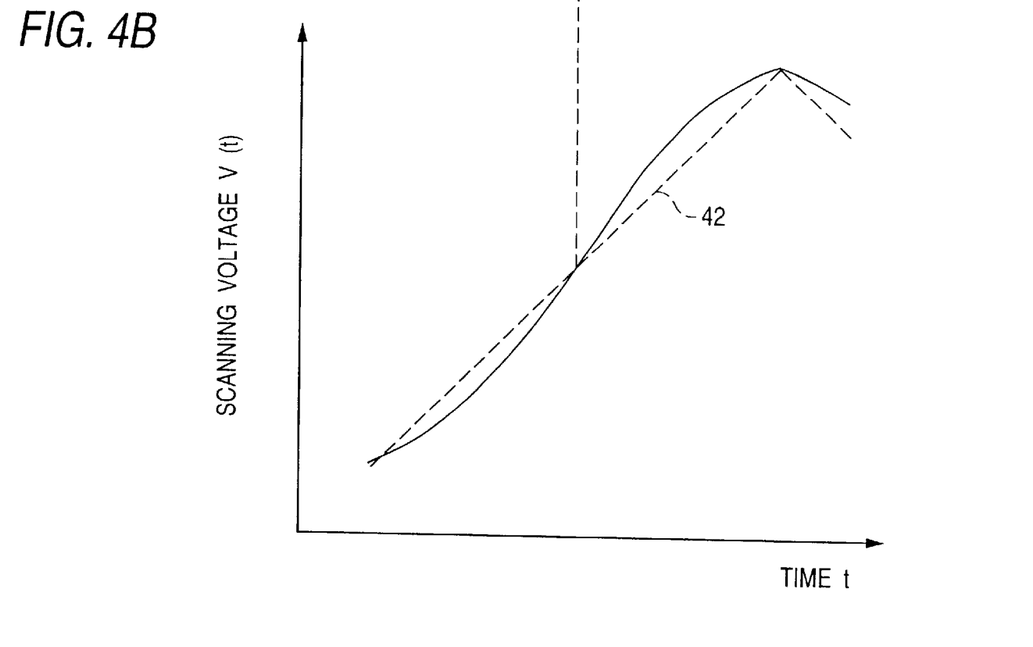
FIG. 4B is a view showing a simplified example of scanning voltage waveform for correcting the deviation.

For example, as shown in FIG. 4A in which deviation is dev(X, $Z_x$), an inclination of scanning voltage V(t) in a portion where deviation dev(X, $Z_x$) becomes negative is reduced to be smaller than the inclination of an essential triangular wave 42 as shown in FIG. 4B. Also, an inclination of scanning voltage V(t) in a portion where deviation dev(X, $Z_x$) becomes positive is increased to be larger than the inclination of the essential triangular wave 42 as shown in FIG. 4B. Consequently, deviation dev(X, $Z_x$) can be made substantially flat, that is, deviation dev(X, $Z_x$) can be made to be 0, and beam current density distribution S(X, $Z_x$) at position $Z_x$ can be made substantially uniform.

In this embodiment, the waveform of scanning voltage V(t) can be reformed by the scanning control unit 34.

Figure 5:
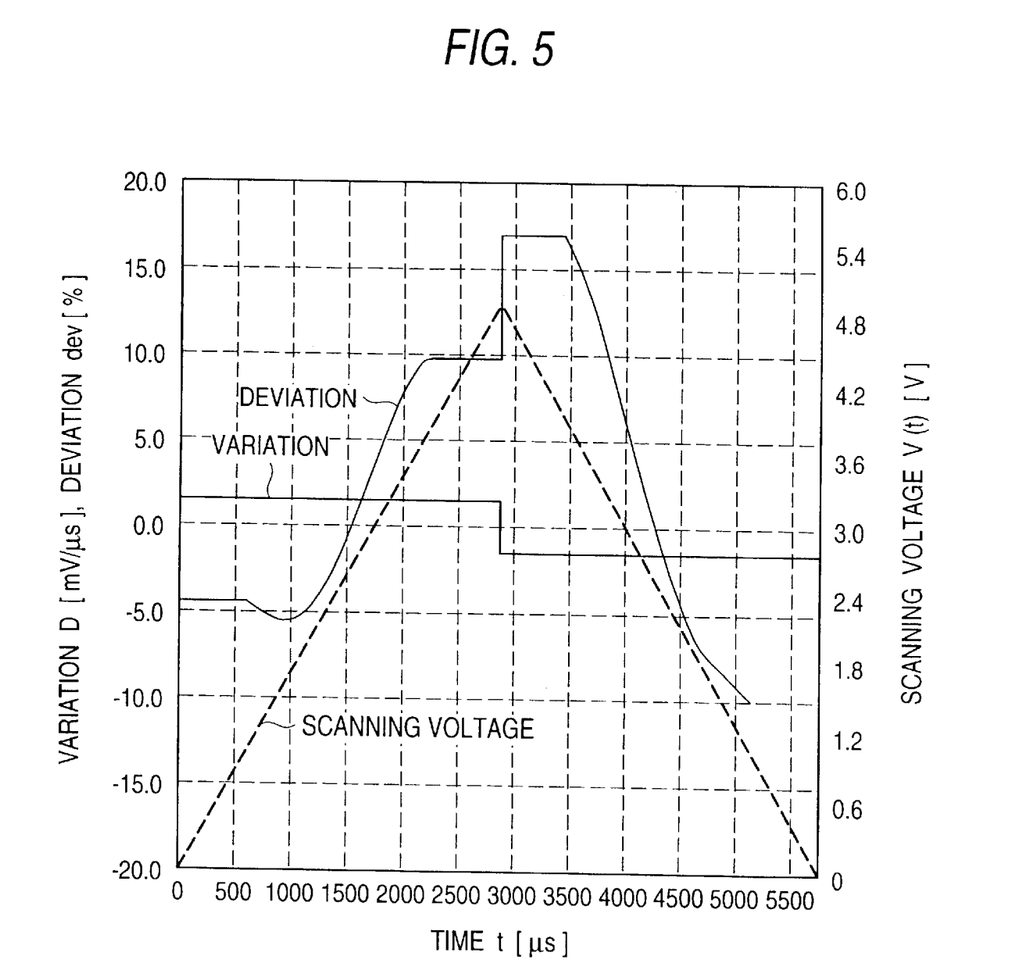
FIG. 5 is a view showing a more specific example of scanning voltage before reformation of the waveform, variation of the scanning voltage concerned and deviation of the beam current density distribution.
Figure 6:
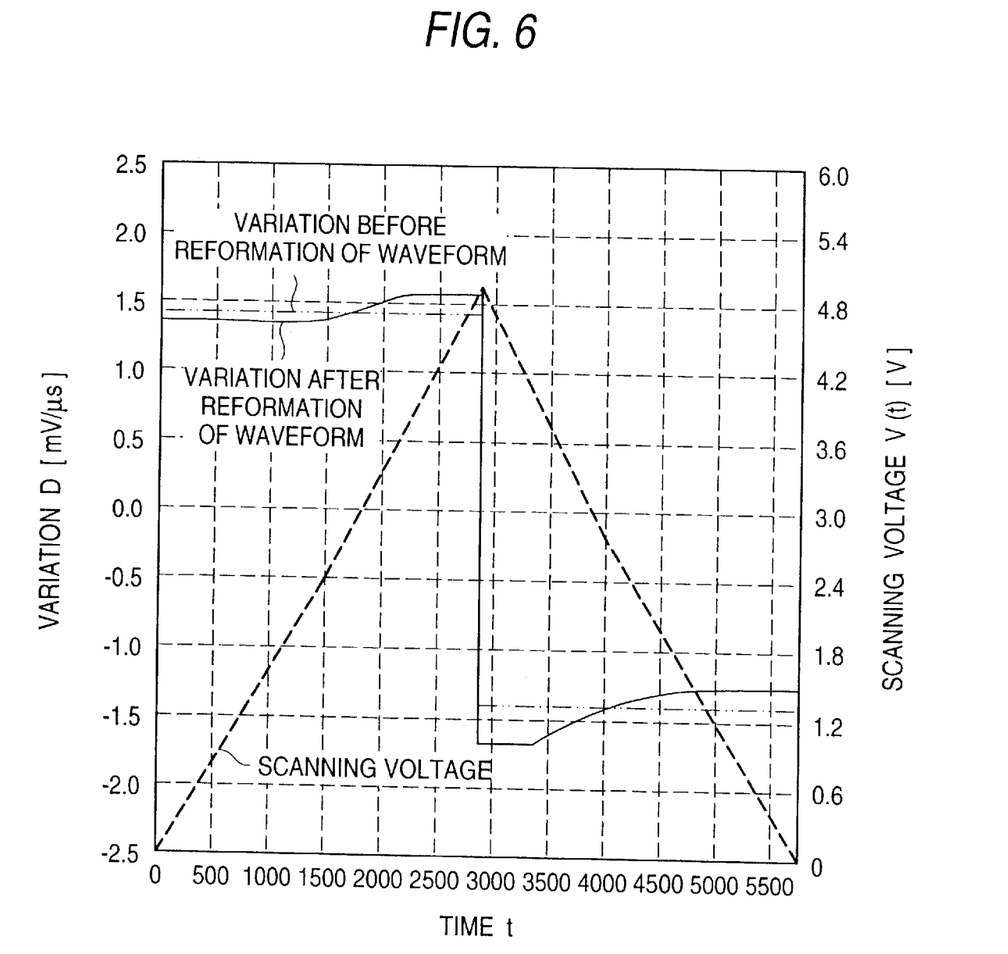
FIG. 6 is a view showing a more specific example of scanning voltage after reformation of the waveform and deviation of the scanning voltage concerned.

More specific examples of scanning voltage V(t) before and after the reformation of the waveform, variation D (=ΔV(t)/Δt) of the scanning voltage concerned, and deviation dev of the beam current distribution are shown in FIGS. 5 and 6. FIG. 5 shows a state before the reformation of the waveform. FIG. 6 shows a state after the reformation of the waveform. Variation D corresponds to an inclination of scanning voltage V(t) described before. Horizontal axes of FIGS. 5 and 6 express time t in this case. Time corresponds to a scanning position of the ion beam 2 in the direction of X. At the point of time when the inclination of scanning voltage V(t) is inverted, that is, at the top of the triangular wave, the scanning direction of the ion beam 2 is inverted. A scale of variations in FIG. 6 is provided when a scale of variations in FIG. 5 is magnified by about 10 times.

When deviation dev in the case of conducting scanning by the ion beam 2, the scanning voltage of which is V(t), of a perfect triangular wave, the variation D of which is constant, is changed to be ± as shown in FIG. 5, it is possible to make deviation dev to be 0 at all times by changing variation D of scanning voltage V(t) so that deviation dev can be canceled and a waveform of scanning voltage V(t) can be reformed to be a form a little different from a perfect triangular wave (in this case, an oblique side of the triangular wave is a little protruded downward).

(3) Next, explanation will be made to a method of irradiating a ion beam 2 to the workpiece 4 (shown in FIG. 8), which is reciprocated in the direction of Y-axis under the condition that the tilt angle is set at θ, while scanning is being conducted by a scanning voltage waveform appropriate for realizing a desired beam current density distribution.

The tilt angle θ, which is constant in the process of implantation, of the workpiece 4 and the holder 6, and momentary position $Y_x$ on Y-coordinate are detected by the holder drive device 24 and supplied to the scanning control unit 34 in real time as shown in FIG. 1. In this specification, real time does not mean a batch processing, but it means an immediate processing.

When the scanning control unit 34 conducts the following calculation in real time using the tilt angle θ and position $Y_x$ on Y-coordinate, it is possible to find position $Z_x$ on Z-coordinate, at which the ion beam 2 is incident upon the workpiece 4, in real time. Referring to FIG. 8, when position $Z_x$, upon which the ion beam 2 is incident, is $Z_2$, $Y_x$ is 0, and when the workpiece 4 is located above that, $Y_x$ is positive, and when the workpiece 4 is located below that, $Y_x$ is negative.

$$Z_x = Z_2 - Y_x \tan \theta \quad \text{[Expression 3]}$$

As described above, it is possible to find position $Z_x$ on Z-coordinate, at which the ion beam 2 is incident upon the workpiece 4, in real time. The workpiece 4 is irradiated with the beam 4 of ions by the scanning voltage waveform realizing the desired beam current density distribution S(X, $Z_x$) according to the above distribution adjusting method. Accordingly, even if the tilt angle θ and the plane size of the workpiece 4 are large, it is possible to irradiate the ion beam 2 in a desired region (for example, all over the surface) of the workpiece 4 by a desired distribution (for example, a uniform distribution). As a result, even when the tilt angle θ and the plane size of the workpiece 4 are large, it is possible to implant ions uniformly all over the surface of the workpiece 4. Therefore, it is possible to make a distribution of quantities of implanted dopant uniform on all surfaces of the workpiece 4.

In order to carry out the above beam irradiation method ideally, it is necessary to find and apply scanning voltage waveforms for an infinite number of positions $Z_x$ on Z-coordinate which satisfy $Z_1 \leq Z_x \leq Z_3$. However, the above method takes a long time. Therefore, the above method is not suitable for practical use. Accordingly, in an actual ion-implantation apparatus, either of the following method (1) or (2) is preferably carried out.

(1) A finite number of scanning voltage waveforms for realizing desired beam current density distributions with respect to a finite number of positions $Z_x$ on Z-coordinate having discrete intervals, which are suitable for practical use and do not affect a result on ion-implantation, are previously found, and they are used being changed over in real time according to position $Y_x$ on Y-coordinate of the workpiece 4. That is, scanning voltage waveforms in the plurality of previously found scanning voltage waveforms, in which positions $Z_x$ on Z-coordinate coincide with position $Z_x$ on Z-coordinate calculated by the above Expression 3 or positions $Z_x$ on Z-coordinate are closest to position $Z_x$ of Z-coordinate calculated by the above Expression 3, are successively selected in real time. The workpiece 4 is irradiated while the ion beam 2 is subjected to scanning by these selected scanning voltage waveforms.

According to the above beam irradiating method, it is sufficient to use a finite number of scanning voltage waveforms. Therefore, the processing time can be shortened and the calculation can be easily conducted, that is, the above beam irradiating method can provide a great effect for practical use.

(2) With respect to a plurality of discrete positions on Z-coordinate located in the workpiece 4, for example, scanning voltage waveforms to realize desired beam current density distributions for the above positions $Z_x$, $Z_2$ and $Z_3$ on Z-coordinate are previously found. Differences between these waveforms are weighted by position $Z_x$ on Z-coordinate calculated by Expression 3. Then, the scanning voltage waveforms for positions $Z_x$ on Z-coordinate are successively calculated. While scanning is conducted by the ion beam 2 with the thus calculated scanning voltage waveforms, the workpiece 4 is irradiated.

According to this beam irradiating method, the number of scanning voltage waveforms to be used is larger than the method described in the above method (1). However, the current density distribution of the actually irradiated beams of ions is more ideal than that of the method described in item (1).

In this embodiment, calculation and changeover of the scanning voltage waveforms described in the above items (1) and (2) can be conducted by the scanning control unit 34.

Figure 2:
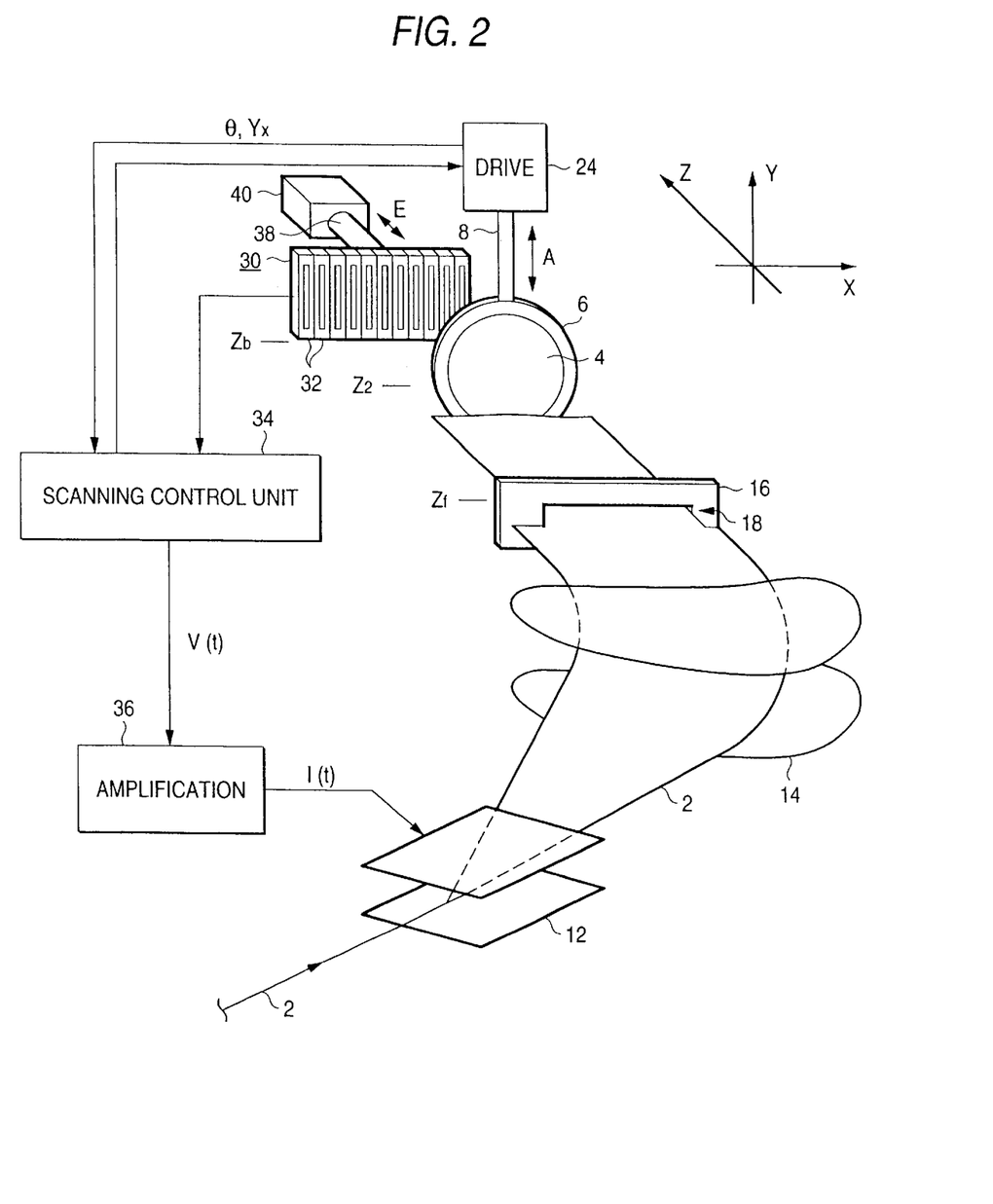
FIG. 2 is a perspective view showing another embodiment of the hybrid scanning type ion-implantation apparatus for carrying out the distribution measuring method of the present invention.

FIG. 2 is a perspective view of showing another embodiment of the hybrid scanning type ion-implantation apparatus in which the distribution measuring method of the present invention is carried out. Different points from the embodiment shown in FIG. 1 will be mainly explained as follows. In this embodiment, instead of two Faraday arrays 20, 30, one Faraday array 30 is used. This Faraday array 30 is moved in the longitudinal direction along Z-axis as shown by arrow E by the actions of the Faraday drive shaft 38 and the Faraday drive unit 40. At positions $Z_f$ and $Z_b$ on Z-coordinate, current density distributions S(X, $Z_f$) and S(X, $Z_b$) of the ion beam 2 are respectively measured.

Due to the foregoing, it is sufficient to provide only one Faraday array. In general, the cost of the Faraday drive unit 40 is lower than that of the Faraday array. Therefore, it is possible to reduce the cost in this embodiment compared with a case in which two Faraday arrays are used. Further, maintenance work can be reduced because the number of Faradays is decreased from two to one. Furthermore, the number of the signal processing circuits used for the Faraday arrays can be decreased to one. Accordingly, the cost can be further reduced.

In the above explanation, the ion beams is used which is a typical example of the beam of charged particles. However, the above distribution measuring method, the distribution adjusting method and the beam irradiating method can be applied to not only the ion beams but also the beam of charged particles except for the ion beams, for example, the above distribution measuring method, the distribution adjusting method and the beam irradiating method can be applied to an electron beam.

Since the present invention is composed as described above, the following effects can be provided.

According to the first aspect of the present invention, it is possible to freely find a distribution of beam current density at an arbitrary position on Z-coordinate located in the workpiece by the measurement of distribution of current density of the first and the second beam. Accordingly, even when the tilt angle and the plane size of the workpiece are large, a state of the distribution of beam current density can be accurately grasped on a surface of the workpiece including a portion in the proximity of an end portion in Y-direction of the workpiece.

According to the second aspect of the present invention, it is possible to freely adjust a distribution of beam current density at an arbitrary position on Z-coordinate located in the workpiece. Accordingly, even if the tilt angle and the plane size of the workpiece are large, it possible to irradiate a beam of charged particles by a desired distribution in a desired region of the workpiece.

According to the third aspect of the present invention, it is possible to irradiate a beam of charged particles to a workpiece in accordance with a position at which the charged particles are incident upon the workpiece while scanning is being conducted by a scanning electric waveform appropriate for realizing a desired distribution of beam current density. Accordingly, even if the tilt angle and the plane size of the workpiece are large, it possible to irradiate a beam of charged particles by a desired distribution in a desired region of the workpiece. Further, this can be conducted by using a finite number of scanning electric waveforms. Therefore, the control of calculation becomes easy. Accordingly, this method can be effectively put into practical use.

According to the fourth aspect of the present invention, although the number of the scanning voltage waveforms to be used in this method is larger than the number of the scanning voltage waveforms to be used in the method of the third aspect of the present invention, the current density distribution of the actually irradiated ion beams of this method is more ideal than that of the method according to the third aspect.

What is claimed is:

1. A method of measuring distribution of a beam of charged particles, applied to an apparatus in which a workpiece is irradiated with the beam of charged particles while the workpiece is mechanically reciprocated along Y-axis and while the beam of charged particles proceeding along Z-axis substantially perpendicular to Y-axis reciprocates and conducts scanning electromagnetically, and in which a tilt angle formed between a surface of the workpiece and the Y-axis can be set at a value more than 0°, the method of measuring distribution of beam of charged particles comprising the steps of:

measuring a first current density distribution in the scanning direction of the beam of charged particles at a first position on Z-coordinate and also measuring a second current density distribution in the scanning direction of the beam of charged particles at a second position on Z-coordinate; and finding a current density distribution in the scanning direction of the beam of charged particles at an arbitrary position on Z-coordinate by the method of interpolation or extrapolation by using the first and the second current density distribution.

2. A method of adjusting distribution of a beam of charged particles comprising the step of:

adjusting a current density distribution in the scanning direction of a beam of charged particles at an arbitrary position on Z-coordinate in the workpiece by reforming a scanning electric waveform of the beam of charged particles so that a scanning speed of the beam of charged particles can be relatively lowered at a position where the current density is to be increased in the current density distribution and also a scanning speed of the beam of charged particles can be relatively raised at a position where the current density is to be decreased, by using the current density distribution of the beam of charged particles at an arbitrary position on Z-coordinate in the workpiece which has been found by the method of measuring distribution of the beam of charged particles described in claim 1.

3. A method of irradiating a beam of charged particles comprising the steps of:

finding previously a plurality of scanning electric waveforms of the beam of charged particles for realizing a desired current density distribution at a plurality of positions on Z-coordinate in the workpiece according to the method of adjusting distribution described in claim 2;

calculating a position on Z-coordinate at which the beam of charged particles is incident upon the workpiece in real time by using the tilt angle of the workpiece in the irradiation of the beam of charged particles and also using a momentary position on Y-coordinate;

selecting successively in real time a scanning electric waveform in which the position on Z-coordinate coincides with or is closest to the position on Z-coordinate calculated before, from the plurality of scanning electric waveforms found previously; and conducting irradiation on the workpiece while the beam of charged particles conducts scanning by the selected scanning electric waveform.

4. A method of irradiating a beam of charged particles comprising the steps of:

finding previously a plurality of scanning electric waveforms of a beam of charged particles for realizing a desired current density distribution at a plurality of positions on Z-coordinate in the workpiece according to the method of adjusting distribution described in claim 2;

calculating in real time a position on Z-coordinate at which the beam of charged particles is incident upon the workpiece by using the tilt angle of the workpiece in the irradiation of the beam of charged particles and also using a momentary position on Y-coordinate;

weighting a difference among the plurality of scanning electric waveforms, which have been previously found, by the position on Z-coordinate which has been calculated before; calculating in real time successively a scanning electric waveform with respect to each position on Z-coordinate which has been calculated before; and conducting irradiation on the workpiece while the beam of charged particles conducts scanning by the calculated scanning electric waveform.

* * * * *